US011929430B2

(12) United States Patent
Detzel et al.

(10) Patent No.: US 11,929,430 B2
(45) Date of Patent: Mar. 12, 2024

(54) HIGH ELECTRON MOBILITY TRANSISTOR WITH DOPED SEMICONDUCTOR REGION IN GATE STRUCTURE

(71) Applicant: Infineon Technologies Austria AG, Villach (AT)

(72) Inventors: Thomas Detzel, Villach (AT); Gerhard Prechtl, Rosegg (AT); Oliver Haeberlen, St. Magdalen (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/563,329

(22) Filed: Dec. 28, 2021

(65) Prior Publication Data

US 2022/0123138 A1 Apr. 21, 2022

Related U.S. Application Data

(62) Division of application No. 16/774,126, filed on Jan. 28, 2020, now Pat. No. 11,257,941.

(51) Int. Cl.
*H01L 29/778* (2006.01)
*H01L 21/02* (2006.01)
(Continued)

(52) U.S. Cl.
CPC ...... *H01L 29/7786* (2013.01); *H01L 21/0254* (2013.01); *H01L 29/1029* (2013.01);
(Continued)

(58) Field of Classification Search
None
See application file for complete search history.

(56) References Cited

U.S. PATENT DOCUMENTS 9,035,355 B2 5/2015 Ostermaier et al.
9,337,279 B2 5/2016 Ostermaier et al.
(Continued)

OTHER PUBLICATIONS

Lagger, Peter, et al., "Towards Understanding the Origin of Threshold Voltage Instability of AlGaN/GaN MIS-HEMTs", Proceedings of the IEEE International Electron Device Meeting, 2012, 1-3.
(Continued)

*Primary Examiner* — Khaja Ahmad
(74) *Attorney, Agent, or Firm* — Murphy, Bilak & Homiller, PLLC

(57) ABSTRACT

A method includes providing a semiconductor body including a plurality of two-dimensional charge carrier gas channels, forming a gate fin by forming a pair of gate trenches in an upper surface of the semiconductor body, the pair of gate trenches exposing each one of two-dimensional charge carrier gas channels, providing source and drain contacts that are electrically connected to each one of the plurality of two-dimensional charge carrier gas channels, providing a gate structure that is configured to control a conductive connection between the source and drain contacts, wherein providing the gate structure includes forming a layer of doped type III-nitride semiconductor material that covers the gate fin and extends into the gate trenches, and forming a conductive gate electrode on top of the layer of doped type III-nitride semiconductor material.

18 Claims, 10 Drawing Sheets

(51) Int. Cl.
- *H01L 29/10* (2006.01)
- *H01L 29/20* (2006.01)
- *H01L 29/205* (2006.01)
- *H01L 29/40* (2006.01)
- *H01L 29/417* (2006.01)
- *H01L 29/423* (2006.01)
- *H01L 29/66* (2006.01)

(52) U.S. Cl.
CPC ........ *H01L 29/2003* (2013.01); *H01L 29/205* (2013.01); *H01L 29/402* (2013.01); *H01L 29/41791* (2013.01); *H01L 29/42316* (2013.01); *H01L 29/66462* (2013.01)

(56) References Cited

U.S. PATENT DOCUMENTS

| | | | |
|---|---|---|---|
| 9,647,104 B2 | 5/2017 | Ostermaier et al. | |
| 9,837,520 B2 | 12/2017 | Ostermaier et al. | |
| 2009/0078966 A1* | 3/2009 | Asai | H01L 29/66462 257/690 |
| 2013/0175580 A1* | 7/2013 | Suh | H01L 29/7781 257/194 |
| 2015/0221748 A1* | 8/2015 | Ostermaier | H01L 21/30604 438/172 |
| 2015/0228729 A1* | 8/2015 | Zhu | H01L 21/28581 257/76 |
| 2015/0249134 A1* | 9/2015 | Ostermaier | H01L 29/785 257/76 |
| 2015/0255590 A1* | 9/2015 | Ostermaier | H01L 29/0688 257/194 |
| 2016/0126340 A1* | 5/2016 | Nechay | H01L 29/1058 257/20 |
| 2016/0190256 A1* | 6/2016 | Vielemeyer | H01L 29/1095 257/340 |
| 2017/0200817 A1* | 7/2017 | Curatola | H01L 29/7783 |
| 2019/0267454 A1* | 8/2019 | Matioli | H01L 29/402 |
| 2020/0373419 A1* | 11/2020 | Cui | H01L 29/0657 |
| 2021/0028295 A1* | 1/2021 | Wathuthanthri | H01L 29/0615 |

OTHER PUBLICATIONS

Ma, Jun, et al., "High Performance Tri-gate GaN Power MOSHEMTs on Silicon Substrate", IEEE Electron Device Letters, 2017, 1-4.

Roccaforte, Fabrizio, et al., "An Overview of Normally-Off GaN-Based High Electron Mobility Transistors", www.mdpi.com/journal/materials, May 15, 2019, 1-18.

* cited by examiner

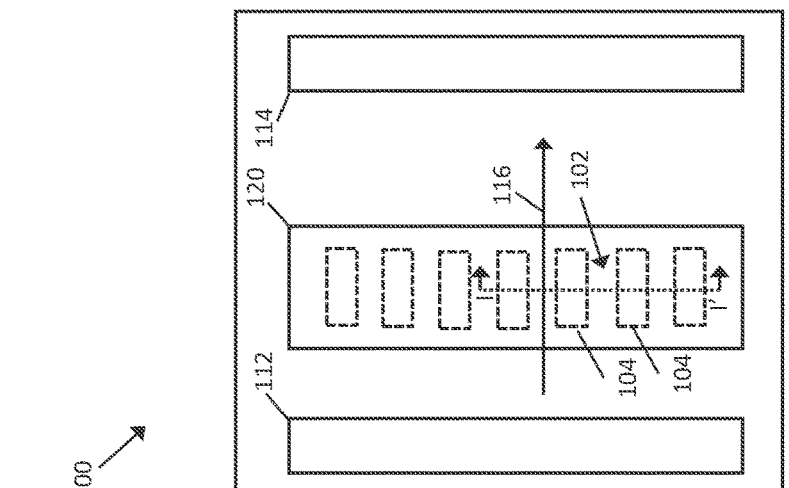
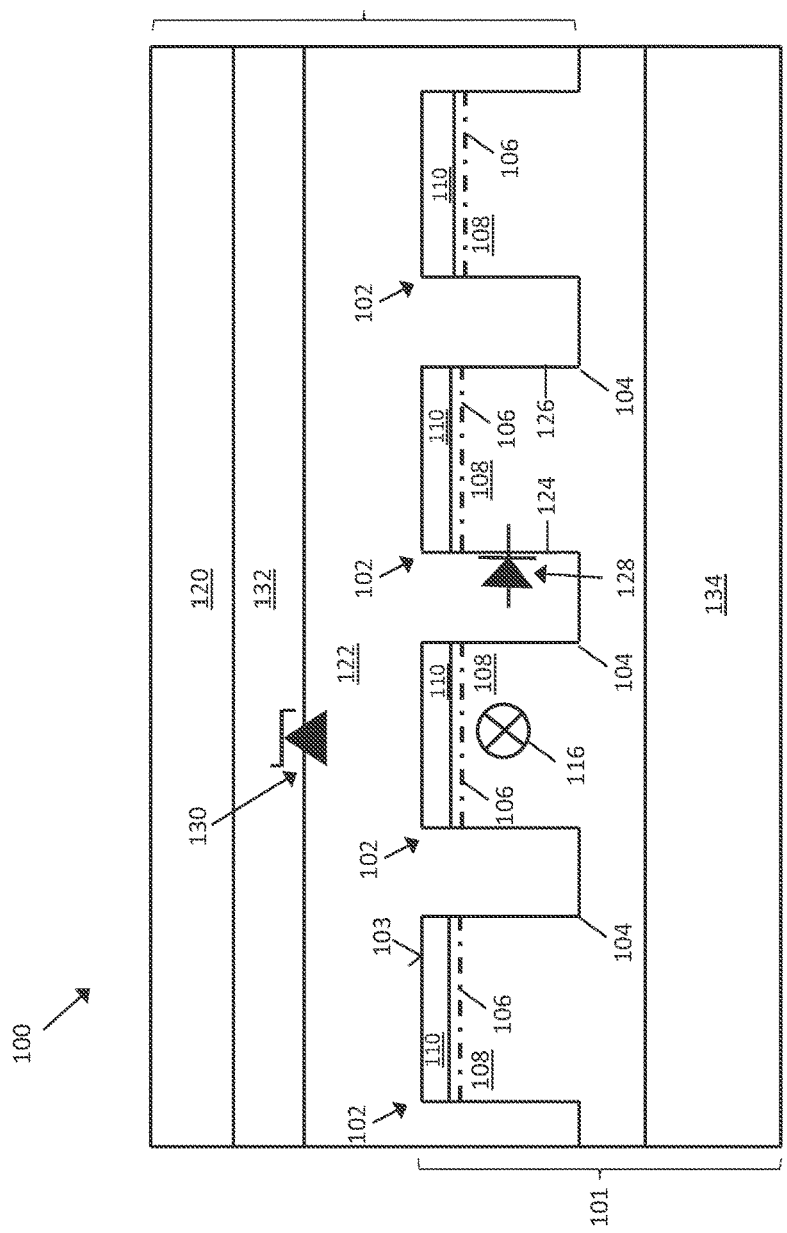
FIG. 1B
FIG. 1A

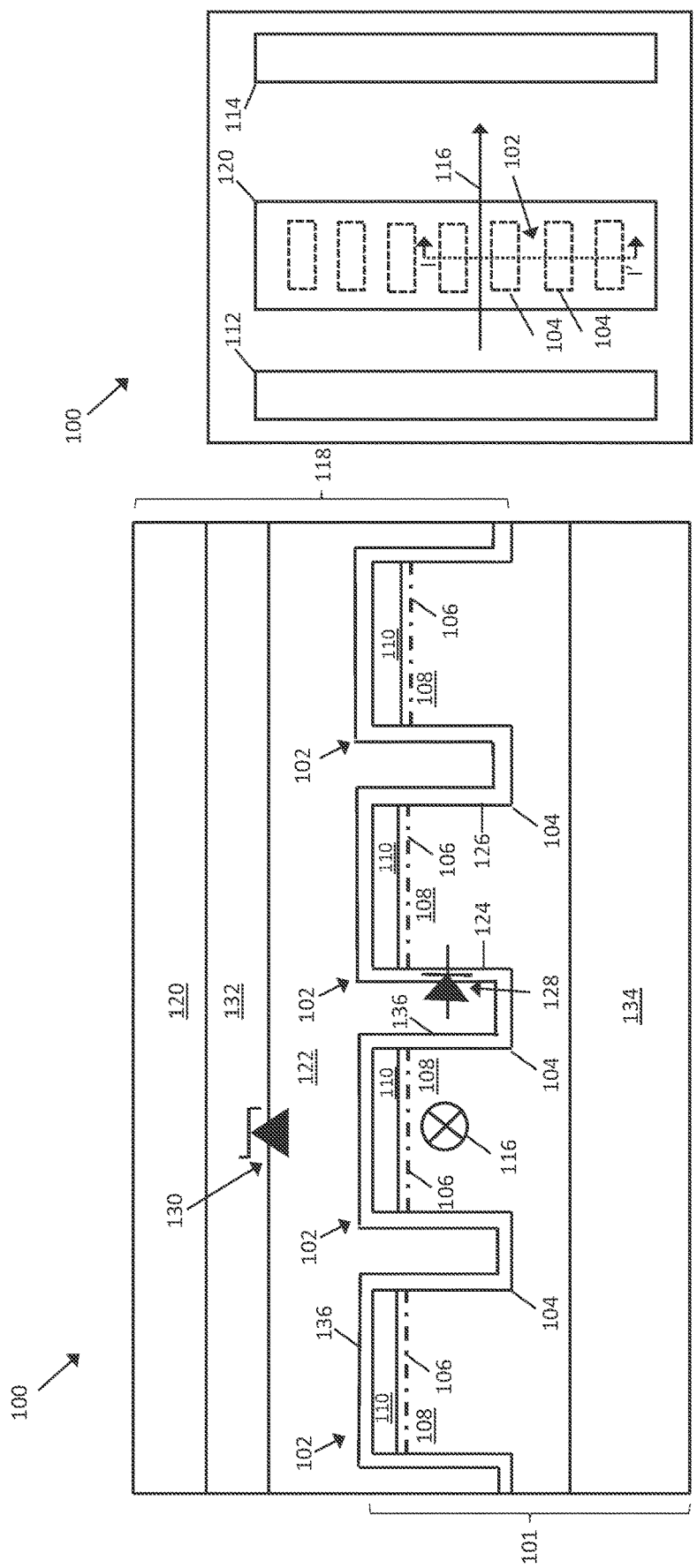

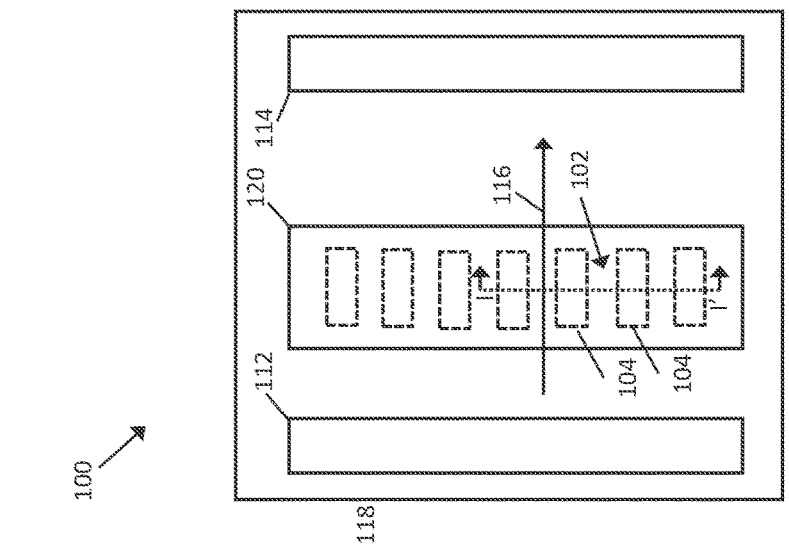
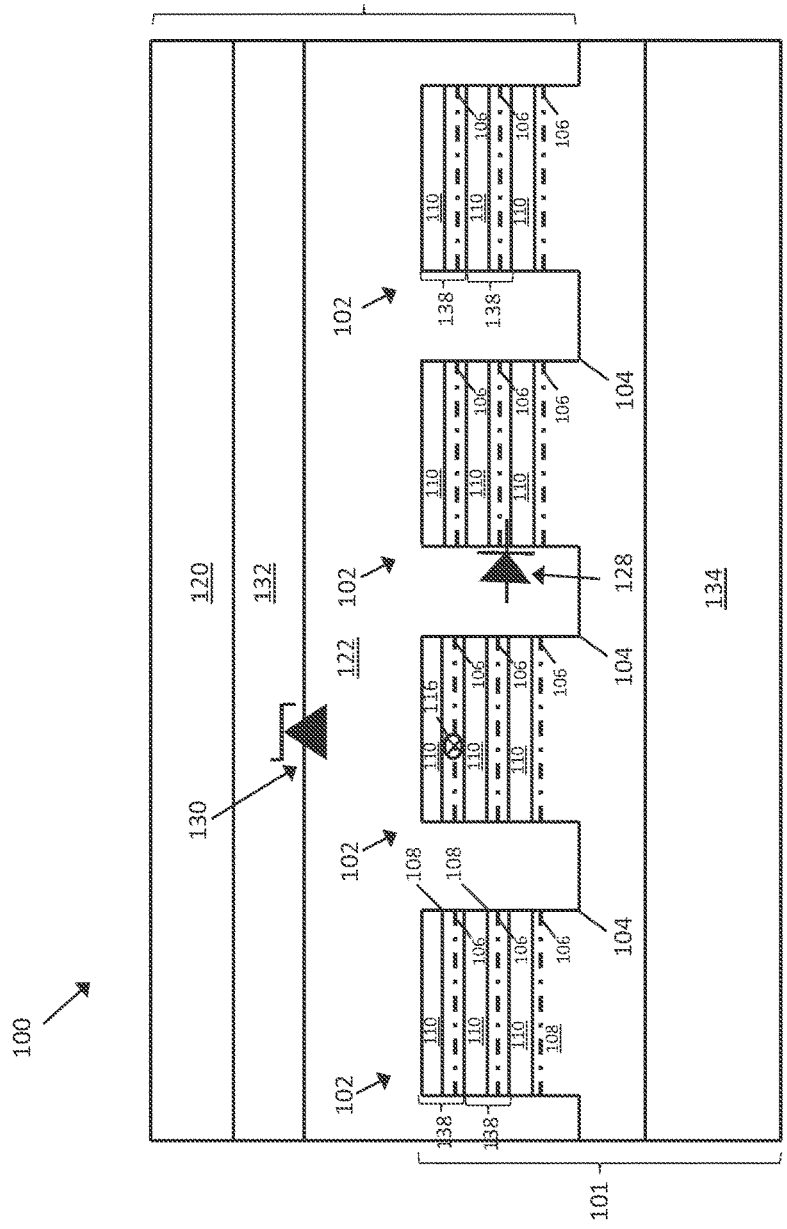
FIG. 3B
FIG. 3A

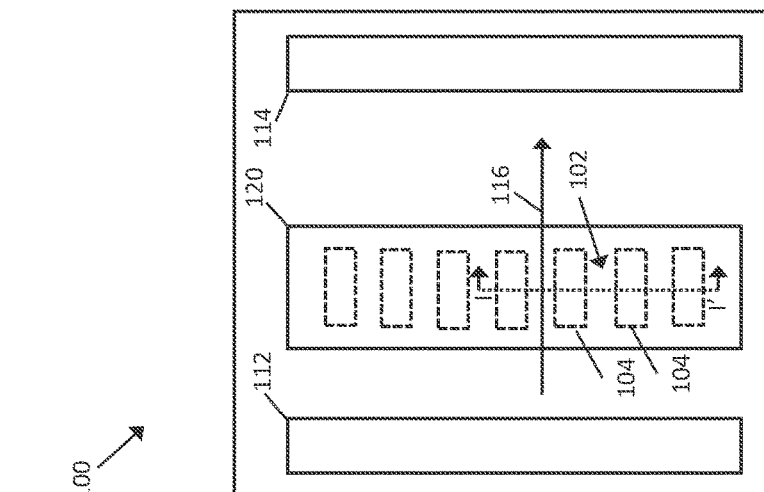
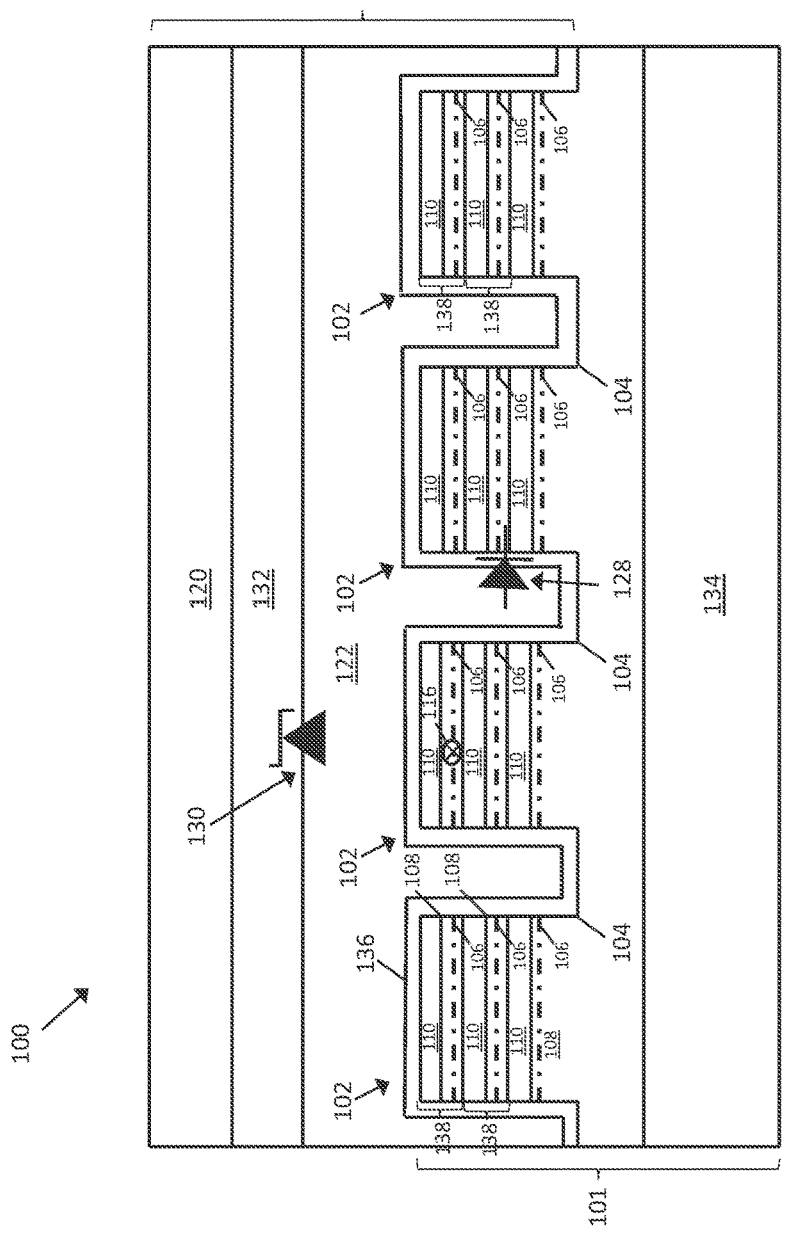
FIG. 4A
FIG. 4B

HIGH ELECTRON MOBILITY TRANSISTOR WITH DOPED SEMICONDUCTOR REGION IN GATE STRUCTURE

RELATED APPLICATIONS

This application is a divisional of and claims priority to U.S. application Ser. No. 16/774,126 filed on Jan. 28, 2020, the content of which is incorporated by reference herein in its entirety.

BACKGROUND

Semiconductor transistors, in particular field-effect controlled switching devices such as a MISFET (Metal Insulator Semiconductor Field Effect Transistor), in the following also referred to as MOSFET (Metal Oxide Semiconductor Field Effect Transistor) and a HEMT (high-electron-mobility Field Effect Transistor) also known as heterostructure FET (HFET) and modulation-doped FET (MODFET) are used in a variety of applications. An HEMT is a transistor with a junction between two materials having different band gaps, such as GaN and AlGaN. In a GaN/AlGaN based HEMT, a two-dimensional electron gas (2DEG) arises near the interface between the AlGaN barrier layer and the GaN channel layer. In an HEMT, the 2DEG forms the channel of the device. Similar principles may be utilized to select channel and barrier layers that form a two-dimensional hole gas (2DHG) as the channel of the device. A 2DEG or a 2DHG is generally referred to as a two-dimensional charge carrier gas. Without further measures, the heterojunction configuration leads to a self-conducting, i.e., normally-on, transistor. A normally-off configured device, which is typically more desirable, must include additional features to deplete the channel region of the HEMT in the absence of gate-source bias.

Due to the high electron mobility of the two-dimensional charge carrier gas in the heterojunction configuration, HEMTs offer high conduction and low losses in comparison to many conventional semiconductor transistor designs. These advantageous conduction characteristics make HEMTs desirable in applications including, but not limited to, use as switches in power supplies and power converters, electric cars, air-conditioners, and in consumer electronics, for example.

Designers are constantly seeking ways to improve the performance of HEMTs, e.g., power consumption and voltage blocking capability. Exemplary device parameters that designers seek to improve include leakage current, threshold voltage (VTH), drain-source on-state resistance ($R_{DSON}$), and maximum voltage switching capability, to name a few.

SUMMARY

A transistor device is disclosed. According to an embodiment, the transistor device comprises a gate fin that is a segment of a semiconductor body disposed between a pair of gate trenches, the pair of gate trenches each being formed in an upper surface of the semiconductor body, a plurality of two-dimensional charge carrier gas channels that are disposed at different vertical depths within the gate fin, each of the two-dimensional charge carrier gas channels in the plurality being formed by a heterojunction between two regions of type III-nitride semiconductor material with different bandgaps, source and drain contacts arranged on either side of the gate fin in a current flow direction of the gate fin, the source and drain contacts each being electrically connected to each one of the two-dimensional charge carrier gas channels, and a gate structure that is configured to control a conductive connection between the source and drain contacts by controlling a conductive state of each one of the two-dimensional charge carrier gas channels within the gate fin. The gate structure comprises a region of doped type III-nitride semiconductor material that covers the gate fin and extends into the gate trenches, and a conductive gate electrode formed over the region of doped type III-nitride semiconductor material.

Separately or in combination, the gate structure further comprises one or more current blocking devices that are configured to prevent carriers from flowing into or out of the region of doped type III-nitride semiconductor material.

Separately or in combination, the gate fin comprises first and second sidewalls that are defined by the pair of gate trenches, each of the two-dimensional charge carrier gas channels extends to the first and second sidewalls of the gate fin, and the one or more current blocking devices are configured to prevent carriers from flowing between the region of doped type III-nitride semiconductor material, and the each of the two-dimensional charge carrier gas channels at the first and second sidewalls of the gate fin.

Separately or in combination, the one or more current blocking devices comprises a layer of type III-nitride semiconductor material that covers the gate fin and is formed along the first and second sidewalls of the gate fin.

Separately or in combination, the gate fin comprises a layered stack of GaN based layer pairs with different aluminum content, the two-dimensional charge carrier gas channels each arise near a heterojunction between the GaN based layers of each layer pair, and the layer of type III-nitride semiconductor material is a layer of AlGaN with a different bandgap as channel layers from the GaN based layer pairs.

Separately or in combination, the gate structure further comprises a conductive Schottky contact material disposed between the gate electrode and the region of doped type III-nitride semiconductor material, and the one or more current blocking devices comprises a Schottky diode formed by a Schottky junction between the Schottky contact material and the doped type III-nitride semiconductor material.

Separately or in combination, the conductive Schottky contact material extends into the gate trenches.

Separately or in combination, the gate fin includes multiple layer pairs of semiconductor nitride layers, wherein each layer pair comprises a barrier layer of type III-nitride semiconductor-alloy and a channel layer of type III-nitride semiconductor, and wherein at least one of the barrier layers or channel layers from one of the layer pairs has a different thickness and/or alloy concentration than corresponding barrier layers or channel layers from other layer pairs within the gate fin.

Separately or in combination, an uppermost barrier layer of the gate fin has a greater thickness than each subjacent one of the barrier layers within the gate fin.

Separately or in combination, each of the semiconductor nitride layers within the gate fin has a thickness of between 5 nm and 80 nm.

Separately or in combination, a separation distance between the pair of gate trenches is 100 nm or less.

Separately or in combination, the gate fin comprises a channel layer of type III-nitride semiconductor material, and the region of doped type III-nitride semiconductor material has a different bandgap as the channel layer.

Separately or in combination, the channel layer is a layer of GaN, and the region of doped type III-nitride semiconductor material is a region of p-type AlGaN.

Separately or in combination, the gate trenches are tapered along the current flow direction such that a width of the gate fin increases as the gate fin approaches the drain contact.

Separately or in combination, both of the gate trenches have a triangular shape with a first side face that faces the source electrode and is substantially orthogonal to the current flow direction and a second side face which extends from the first side face to a point which faces the drain electrode.

Separately or in combination, both of the gate trenches comprise a rectangular section and a tapered section, the gate fin has a substantially uniform width between the rectangular sections of the gate trenches, and the width of the gate fin increases between the tapered sections of the gate trenches as the gate fin approaches the drain contact.

Separately or in combination, both of the gate trenches are tapered in a vertical direction that is perpendicular to the upper surface of the semiconductor body such that a width of the gate trench decreases moving towards a bottom of the gate trench.

Separately or in combination, the gate electrode comprises first and second outer edge sides that extend transversely to the current flow direction, and the gate trenches are both completely contained within the first and second outer edge sides of the gate electrode.

Separately or in combination, the gate electrode comprises first and second outer edge sides that extend transversely to the current flow direction, and the gate trenches both extend past one or both of the first and second outer edge sides of the gate electrode.

According to another embodiment, the transistor device comprises a gate fin that is a segment of a semiconductor body disposed between a pair of gate trenches, the pair of gate trenches each being formed in an upper surface of the semiconductor body, a plurality of two-dimensional charge carrier gas channels that are disposed at different vertical depths within the gate fin, each of the two-dimensional charge carrier gas channels in the plurality being formed by a heterojunction between two regions of type III-nitride semiconductor material with different bandgaps, and a gate structure that is formed on top of the gate fin and extends into both of the gate trenches. The gate structure is configured to apply a vertical electric field from above the gate fin and a lateral electric field from outside of first and second opposite facing sidewalls of the gate fin, the vertical electric field and the lateral electric field collectively controlling a conductive state of each of the two-dimensional charge carrier gas channels within the gate fin. The gate structure comprises a region of doped type III-nitride semiconductor material that is configured to apply the lateral and vertical electric fields.

Separately or in combination, the gate structure further comprises one or more current blocking devices that are configured to prevent carriers from flowing into or out of the region of doped type III-nitride semiconductor material.

A method of forming a transistor device is disclosed. According to an embodiment, the method comprises providing a semiconductor body comprising a plurality of two-dimensional charge carrier gas channels that are disposed at different vertical depths below an upper surface of the semiconductor body, forming a gate fin in the semiconductor body by forming a pair of gate trenches in an upper surface of the semiconductor body, the pair of gate trenches exposing each one of the two-dimensional charge carrier gas channels in the plurality at first and second sidewalls of the gate fin, providing source and drain contacts that are arranged such that the gate fin is between the source and drain contacts in a current flow direction of the gate fin and such that each of the source and drain contacts is electrically connected to each one of the two-dimensional charge carrier gas channels, providing a gate structure that is configured to control a conductive connection between the source and drain contacts by controlling a conductive state of each one of the two-dimensional charge carrier gas channels. Providing the gate structure comprises forming a layer of doped type III-nitride semiconductor material that covers the gate fin and extends into the gate trenches, and forming a conductive gate electrode on top of the layer of doped type III-nitride semiconductor material.

Separately or in combination, providing the gate structure comprises depositing a blanket layer of the doped type III-nitride semiconductor material, depositing a conductive Schottky contact material on top of the blanket layer of the doped type III-nitride semiconductor material, and using the conductive Schottky contact material as an etch mask to form a self-aligned edge side of the gate structure.

Separately or in combination, providing the gate structure comprises depositing a blanket layer of the doped type III-nitride semiconductor material, structuring the blanket layer of the doped type III-nitride semiconductor material to include an edge side which faces the drain electrode, forming a passivation layer that covers the upper surface of the semiconductor body and extends over the edge side of the doped type III-nitride semiconductor material, and depositing a conductive Schottky contact material such that the Schottky contact material contacts the doped type III-nitride semiconductor material and extends over the passivation layer.

Separately or in combination, the Schottky contact material is formed to extend past the edge side of the doped type III-nitride semiconductor material, and the method further comprises configuring the Schottky contact material that extends past the edge side of the doped type III-nitride semiconductor material as a field plate.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIGS. 1A and 1B, illustrates a transistor device, according to an embodiment. FIG. 1B shows the transistor device from a plan-view perspective. FIG. 1A shows the transistor device from a cross-sectional perspective along the cross-sectional line I-I' shown in FIG. 1B.

FIG. 2, which includes FIGS. 2A and 2B, illustrates a transistor device, according to an embodiment. FIG. 2B shows the transistor device from a plan-view perspective. FIG. 2A shows the transistor device from a cross-sectional perspective along the cross-sectional line I-I' shown in FIG. 2B.

FIG. 3, which includes FIGS. 3A and 3B, illustrates a transistor device, according to an embodiment. FIG. 3B shows the transistor device from a plan-view perspective.

FIG. 3A shows the transistor device from a cross-sectional perspective along the cross-sectional line I-I' shown in FIG. 3B.

FIG. 4, which includes FIGS. 4A and 4B, illustrates a transistor device, according to an embodiment. FIG. 4B shows the transistor device from a plan-view perspective. FIG. 4A shows the transistor device from a cross-sectional perspective along the cross-sectional line I-I' shown in FIG. 4B.

FIG. 5, which includes FIG. 5B shows the transistor device from a plan-view perspective. FIG. 5A shows the transistor device from a cross-sectional perspective along the cross-sectional line I-I' shown in FIG. 5B.

FIG. 6, which includes FIG. 6B shows the transistor device from a plan-view perspective. FIG. 6A shows the transistor device from a cross-sectional perspective along the cross-sectional line I-I' shown in FIG. 6B.

FIG. 7, which includes FIG. 7B shows the transistor device from a plan-view perspective. FIG. 7A shows the transistor device from a cross-sectional perspective along the cross-sectional line I-I' shown in FIG. 7B.

FIG. 8, which includes

FIG. 9, which includes

FIG. 10, which includes FIG. 10A shows the transistor device from a plan-view perspective. FIG. 10B shows the transistor device from a cross-sectional perspective along the cross-sectional line II-II' shown in FIG. 10A, according to an embodiment. FIG. 10C shows the transistor device from a cross-sectional perspective along the cross-sectional line II-II' shown in FIG. 10A, according to an embodiment. FIG. 10D shows the transistor device from a cross-sectional perspective along the cross-sectional line II-II' shown in FIG. 10A, according to an embodiment. FIG. 10E shows the transistor device from a cross-sectional perspective along the cross-sectional line II-II' shown in FIG. 10A, according to an embodiment.

DETAILED DESCRIPTION

Figure 5B:
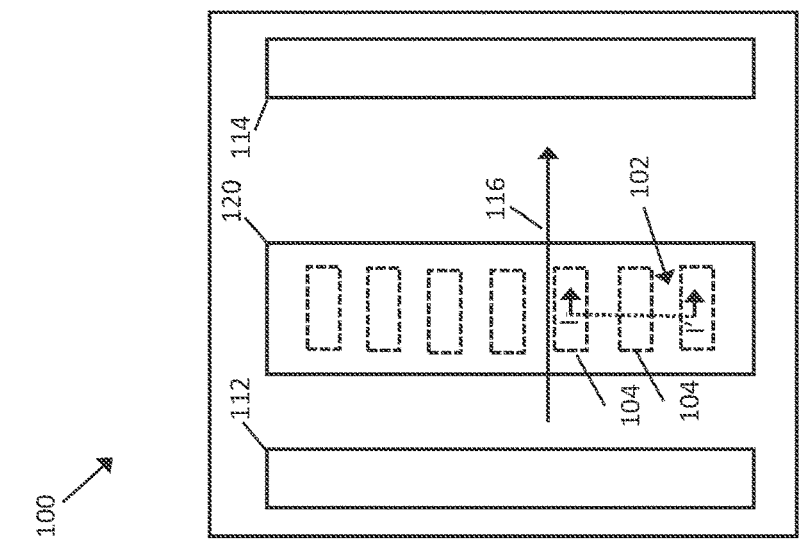
FIGS. 5A and 5B, illustrates a transistor device, according to an embodiment.

Embodiments of a high-electron-mobility field effect transistor (HEMT) with a fin-shaped gate configuration are described herein. In this device configuration, the gate of the transistor is provided by a fin-shaped segment of the semiconductor body, i.e., a mesa structure with vertical semiconductor sidewalls. The fin-shaped segment includes a two-dimensional charge carrier gas that arises near a heterojunction within the semiconductor body and provides the channel of the device. The gate structure of the transistor wraps around the fin-shaped segment. This allows the gate structure to control the two-dimensional charge carrier gas in a vertical direction, i.e., from above the fin, and in a horizontal direction, i.e., across the sidewalls of the fin. Examples of these devices are described in U.S. Pat. No. 9,035,355 to Ostermaier, the content of which is incorporated by reference herein in its entirety, U.S. Pat. No. 9,647,104 to Ostermaier, the content of which is incorporated by reference herein in its entirety, and U.S. Pat. No. 9,837,520 to Ostermaier, the content of which is incorporated by reference herein in its entirety.

The embodiments disclosed herein provide a fin-shaped gate configured high-electron-mobility field effect transistor (HEMT) with improved electrical characteristics. According to embodiments, the gate structure of the transistor includes a region of doped type III-nitride semiconductor material (e.g., p-type GaN) that surrounds the fin-shaped segment of the semiconductor body on all three sides, i.e., from above and on either side of the fin. This structure is highly effective at depleting the two-dimensional charge carrier gas in all three directions and results in beneficial ON-OFF control. This is especially beneficial in the case that the gate fin has a multi-channel configuration with a plurality of two-dimensional charge carrier gas channels disposed within the gate fin. However, the doped material in the gate structure may contribute to gate leakage by creating a leakage path at the sidewalls of the gate fin. Embodiments described herein include current blocking devices that are incorporated into the gate structure of the transistor and mitigate this gate leakage issue. In one example, the gate structure includes a Schottky diode integrated into the gate metal. This Schottky diode prevents carriers (e.g., holes) from entering the doped type III-nitride semiconductor material and ultimately contributing to gate leakage. In another example, the gate structure includes a layer of type III-nitride semiconductor alloy material (e.g., AlGaN) that is formed along the sidewalls of the gate fin. This layer creates a PIN diode between the two-dimensional charge carrier gas channel and the doped type III-nitride semiconductor material, thereby inhibiting carrier flow in both directions.

Referring to FIG. 1, a transistor device 100 is depicted, according to an embodiment. The transistor device 100 includes a gate fin 102. The gate fin 102 is segment of a semiconductor body 101 disposed between a pair of gate trenches 104. The gate trenches 104 are formed in an upper surface 103 of the semiconductor body 101. A two-dimensional charge carrier gas channel 106 is disposed within the gate fin 102. The two-dimensional charge carrier gas channel 106 is formed by a heterojunction between two regions of type III-nitride semiconductor material with different bandgaps. These regions include a channel layer 108 and a barrier layer 110. The bandgap difference between the regions can be created by a difference in alloy concentration. For instance, in one embodiment, the channel layer 108 is a region of GaN (Gallium Nitride) and the barrier layer 110 is a region of AlGaN (Aluminum Gallium Nitride). In this case, a 2DEG (two-dimensional electron gas) arises in the channel layer 108 near the heterojunction. Similar principles may be used to provide a 2DHG (two-dimensional hole gas) as the channel of the transistor device 100.

As shown in FIG. 1B, the transistor device 100 includes source and drain contacts 112, 114. The source and drain contacts 112, 114 are arranged on either side of the gate fin 102 in a current flow direction 116 of the gate fin 102. The current flow direction 116 refers to a direction that electrons flow during a forward biased ON state of the transistor device 100. The gate trenches 104 are formed such that continuous two-dimensional charge carrier gas region extending between the source and drain contacts 112, 114 enters and exits in the gate fin 102. The source and drain contacts 112, 114 may be formed from an electrically conductive material, e.g., copper, aluminum, tungsten, etc., and alloys thereof. The source and drain contacts 112, 114 are in ohmic contact with the two-dimensional charge carrier gas channel. For example, the source and drain contacts 112, 114 may be in ohmic contact with the two-dimensional charge carrier gas channel 106 within that semiconductor body 101 at a location outside of the gate fin 102 by a combination of electrical conductors, doped regions, trench structures, etc.

The transistor device 100 includes a gate structure 118 that is configured to control a conductive connection between the source and drain contacts 112, 114. This is done by controlling a conductive state of the two-dimensional charge carrier gas channels 106 within the gate fins 102. When appropriately biased, the gate structure 118 can fully deplete the two-dimensional charge carrier gas channel 106 within the gate fin 102, thereby turning the device OFF. Likewise, when appropriately biased, the gate structure 118 can place the two-dimensional charge carrier gas channel 106 in a conductive state, thereby turning the device ON. The gate structure 118 includes a gate electrode 120 that receives the gate bias. The gate electrode 120 may be formed from an electrically conductive material, e.g., copper, aluminum, tungsten, etc., and alloys thereof.

According to an embodiment, the gate structure 118 includes a region of doped type III-nitride semiconductor material 122. The region of doped type III-nitride semiconductor material 122 covers the gate fin 102 and extends into the pair of gate trenches 104 on either side of the gate fin 102. That is, the region of doped type III-nitride semiconductor material 122 is disposed above the gate fin 102 and is disposed laterally adjacent to first and second sidewalls 124, 126 of the gate fin 102 that are defined by the gate trenches 104. In this way, the region of doped type III-nitride semiconductor material 122 is configured to apply a vertical electric field from above the gate fin 102 and a lateral electric field from outside of the first and second sidewalls 124, 126 of the gate fin 102. The vertical electric field and the lateral electric field can collectively fully deplete the two-dimensional charge carrier gas, thereby providing ON/OFF control of the device. According to an embodiment, the region of doped type III-nitride semiconductor material 122 is configured to fully deplete the two-dimensional charge carrier gas channel 106 at zero bias applied to the gate electrode 120. This provides a normally-off configuration. Exemplary dopant concentration values for the region of doped type III-nitride semiconductor material 122 may be in the range of $10^{17}$ dopant atoms/cm$^{-3}$ to $5\times10^{20}$. In a preferred embodiment, this value is about $5\times10^{19}$ to $1\times10^{20}$ dopant atoms/cm$^{-3}$, which is sufficient to fully deplete the two-dimensional charge carrier gas channel 106 at zero gate bias in embodiments.

By providing the region of doped type III-nitride semiconductor material 122 to surround three sides of the fin-shaped gate of the HEMT, several performance improvements are obtained in the transistor device 100. For example, the device has a reduced IV curve hysteresis (characterizing ON-OFF operation across a range of gate voltages) in comparison to a metal-insulator-semiconductor (MIS) configuration. However, one drawback of the doped-semiconductor fin-shaped configuration is increased gate leakage current in comparison to other device configurations, including the MIS configuration. The gate leakage current mechanism of this device is as follows. When the gate electrode 120 is positively biased, carriers may be injected from the gate electrode 120 into the region of doped type III-nitride semiconductor material 122. The region of doped type III-nitride semiconductor material 122 forms a p-n junction with the semiconductor material of the gate fin 102. This p-n junction creates a diode 128 that when forward biased permits carriers to flow into the two-dimensional charge carrier gasses present within the gate fin 102 and to the source/drain of the device. A similar reverse leakage phenomenon may occur in the opposite direction if the device is reverse biased. In that case, the carriers must overcome the reverse blocking voltage of the diode 128. In the absence of measures to curtail this gate leakage, the power consumption of the device is detrimentally increased.

According to an embodiment, the gate structure 118 further comprises one or more current blocking devices that are configured to prevent carriers from flowing into or out of the region of doped type III-nitride semiconductor material 122. The current blocking device advantageously mitigates the above described gate leakage current by preventing or suppressing current flow between the region of doped type III-nitride semiconductor material 122 and the gate fin 102. As will be detailed below, the current blocking device may prevent carriers from entering the doped type III-nitride semiconductor material at the gate electrode 120 side, thereby depriving the region of doped type III-nitride semiconductor material 122 of carriers. In addition, or in the alternative, the current blocking device may prevent carriers from flowing between the region of doped type III-nitride semiconductor material 122 and the two-dimensional charge carrier gas channel 106(s) within the gate fin 102, thereby blocking the leakage current at this interface. Generally speaking, the current blocking device can be implemented by any of a variety of structures that inhibit carrier flow in at least one direction. Examples of these structures include electrical insulators, low-doped or intrinsically doped regions of semiconductor materials, and p-n junctions.

In the embodiment of FIG. 1, the transistor device 100 includes a Schottky diode 130 incorporated into the gate structure 118 that provides a current blocking device. The Schottky diode 130 is provided by a conductive Schottky contact material 132 disposed between the gate electrode 120 and the region of doped type III-nitride semiconductor material 122. The Schottky diode 130 is reverse biased when the gate electrode 120 is positively biased relative to the source contact 112. Thus, the Schottky diode 130 prevents injection of carriers (e.g., holes) from the gate electrode 120 into the region of doped type III-nitride semiconductor material 122 under positive gate bias. The Schottky contact material 132 is an electrically conductive material that creates an energy barrier at the metal-semiconductor interface. Examples of Schottky contact materials 132 include titanium, gold, platinum, tungsten, molybdenum, nickel, tantalum, etc., nitrides and alloys thereof.

Exemplary device parameters for the transistor device 100 are as follows. The channel layer 108 may be provided from an UID (unintentionally doped) region of GaN, and the barrier layer 110 may be a layer of AlGaN that is deposited on top of the UID region of GaN. The UID region of GaN may have a thickness of between 50 nm (nanometers) and 1000 nm. In a preferred embodiment, this thickness is in the range of 100 nm to 500 nm. The barrier layer 110 may have a thickness of between 5 nm and 100 nm. In a preferred embodiment, this thickness is in the range of 5 nm to 20 nm for the single channel gate fin 102 embodiment of FIG. 1. The thicknesses of the UID region of GaN and the channel layer 108 are measured in a direction that is perpendicular to the upper surface 103 of the semiconductor body 101. The width of the gate trenches 104 may be between 200 nm and 500 nm. In a preferred embodiment, this width is in the range of 100 nm to 200 nm. This width is measured between a sidewall of the gate trench 104 that defines the gate fin 102 and an opposite facing sidewall of the same gate trench 104. A separation distance between the pair of gate trenches 104 that define one of the gate fins 102 may be between 30 nm and 1000 nm. In a preferred embodiment, this separation distance is greater than about 100 nm. The separation distance is measured in a direction parallel to the upper surface 103 of the semiconductor body 101. The length of the gate trenches 104 may be between 50 nm and 2 µm. In a preferred embodiment, this length is in the range of 20 nm to 150 nm. The length is measured between opposite ends of the gate trenches 104 that are spaced apart from one another in the current flow direction 116.

The transistor device 100 may be formed according to the following technique. Initially, a semiconductor wafer is provided to include a seed region 134. Generally speaking, the seed region 134 can include any semiconductor material that is suitable for the epitaxial growth of type-III nitride material thereon. For example, the seed region 134 may include silicon (Si), sapphire, group IV compound semiconductor materials such as silicon carbide (SiC) or silicon germanium (SiGe), type III-V semiconductors including gallium nitride, gallium arsenide (GaAs), aluminium nitride (AlN), aluminium arsenide (AlAs), indium nitride (InN), indium arsenide (InAs), etc. The seed region 134 can be provided by a commercially available semiconductor wafer, for example. Additionally or alternatively, the seed region 134 may have a SOI (silicon on insulator) configuration. A thin nucleation layer (not shown) that is conducive to the growth of type III-V semiconductor thereon, e.g., a 100-200 nm layer of aluminum nitride, may be provided on the seed region 134. A region of type-III nitride semiconductor material (e.g., GaN), which provides the channel layer 108, is then formed on the seed region 134, e.g., using an epitaxial deposition technique. A region of alloyed type III-nitride semiconductor (e.g., AlGaN), which provides the barrier layer 110, is then formed on the channel layer 108, e.g., using an epitaxial deposition technique. The gate trenches 104 are then formed in the desired geometry, e.g., using an etching technique such as plasma etching, wet chemical etching, etc. The region of doped type III-nitride semiconductor material 122 (e.g., p-type GaN) is then formed on the semiconductor body 101. The region of doped type III-nitride semiconductor material 122 can be formed as a blanket layer that covers the complete upper surface 103 of the semiconductor body 101. Subsequently, a structuring technique, e.g., masked etching, may be performed to remove the doped type III-nitride semiconductor material outside the region of the gate structure 118. The conductive Schottky contact material 132 may then be deposited on top of the doped type III-nitride semiconductor material, followed by deposition of the gate electrode 120 material on top of the Schottky contact material 132.

According to an embodiment, the region of doped type III-nitride semiconductor material 122 has a different bandgap as the channel layer 108. This may be obtained by alloying the region of doped type III-nitride semiconductor material 122 to create a bandgap difference between the two materials. For example, the region of doped type III-nitride semiconductor material 122 may be a region of p-type AlGaN, whereas the channel layer 108 is a layer of unintentionally doped GaN or AlGaN with a lower aluminum content than the region of doped type III-nitride semiconductor material 122. The band offset between the two regions creates an energy barrier that prevents carriers in the two-dimensional charge carrier gas 106 from entering the doped type III-nitride semiconductor material 122. As a result, the reverse leakage characteristics of the device are beneficially improved.

Referring to FIG. 2, the transistor device 100 is depicted, according to another embodiment. In this embodiment, the transistor device 100 additionally includes a layer of type III-nitride semiconductor material 136 that covers the gate fin 102 and is formed along the first and second sidewalls 124, 126 of the gate fin 102. The layer of type III-nitride semiconductor material 136 can be a doped or unintentionally doped layer of material. Exemplary dopant values for the layer of type III-nitride semiconductor material 136 may be in the range of $10^{15}$ dopant atoms $cm^{-3}$ to $10^{19}$ dopant atoms $cm^{-3}$. This layer of type III-nitride semiconductor material 136 separates the region of doped type III-nitride semiconductor material 122 from the two-dimensional charge carrier gas channel(s) 106 present at the first and second sidewalls 124, 126 of the gate fin 102. In an embodiment, the layer of type III-nitride semiconductor material 136 a layer of AlGaN. This layer may be conformally deposited (e.g., by epitaxy) after the gate trench etching step and before the deposition of the doped type III-nitride semiconductor material.

The layer of type III-nitride semiconductor material 136 provides an additional current blocking device in the gate structure 118. This current blocking device is configured to prevent carrier flow in both directions between the two-dimensional charge carrier gas channel(s) 106 present at the first and second sidewalls 124, 126 of the gate fin 102 and the region of doped type III-nitride semiconductor material 122. The layer of type III-nitride semiconductor material 136 has the effect of converting the above discussed diode 128 into a so-called PIN diode, i.e., a diode with an intrinsic region sandwiched between p-type and n-type regions. As is known, the PIN diode has higher characteristic voltages in both the forward and reverse directions than a corresponding P-N junction diode. Accordingly, the forward and reverse leakage currents are mitigated by this structure. In particular, the above discussed leakage path for holes from the region of doped type III-nitride semiconductor material 122 to enter a 2DHG within the gate fin 102 is blocked by the layer of type III-nitride semiconductor material 136.

The gate structure 118 may include either one or both of the Schottky diode 130 and the layer of type III-nitride semiconductor material 136 as the current blocking device. For instance, instead of the Schottky-gate configuration shown in FIG. 2, the transistor device 100 may include an ohmic connection between the doped type III-nitride semiconductor material 122 and the gate electrode 120, wherein the layer of type III-nitride semiconductor material 136 is provided in a similar manner. In that case, the properties of the layer of type III-nitride semiconductor material 136 (e.g., thickness or alloy concentration) can be suitably adapted to provide the desired electrical isolation.

Referring to FIG. 3, the transistor device 100 is depicted, according to another embodiment. In this embodiment, the gate fin 102 has a multi-channel configuration. In more detail, the gate fin 102 includes a plurality of two-dimensional charge carrier gas channels 106 that are disposed at different vertical depths within the gate fin 102. Each of the two-dimensional charge carrier gas channels 106 are formed by a heterojunction between two regions of type III-nitride semiconductor material with different bandgaps. While the depicted embodiment shows a device with three of the two-dimensional charge carrier gas channels 106, any plurality of two-dimensional charge carrier gas channels 106, e.g., 2, 3, 4, 5, etc., may be provided using the concepts described herein.

The multi-channel configured gate fin 102 configuration may be obtained by initially providing a semiconductor body 101 to include a layered stack of heterojunction forming layers. The layered stack includes layer pairs 138 of III-nitride semiconductor material that form a heterojunction within each other. Each layer pair 138 includes a barrier layer 110 and a channel layer 108. The barrier layer 110 and channel layer 108 of each layer pair 138 may be type III-nitride semiconductors with different alloy concentration. For example, the semiconductor body 101 may be formed to include multiple layers of GaN arranged alternatingly with layers of AlGaN, wherein the GaN layers form the channel layers 108 and the AlGaN layers form the barrier layers 108. In another example, the semiconductor body 101 may be formed to include layers of $Al_xGa_{1-x}N$ arranged alternatingly with layers of $Al_yGa_{1-y}N$, wherein the lower aluminum content layers form the channel layers 108 and the higher aluminum content layers form the barrier layers 108. In either case, the heterojunction forming layers may be formed by successive epitaxial deposition steps, wherein the alloy concentration (e.g., aluminum in the above example) is varied for each layer. After the semiconductor body 101 with the layered stack of heterojunction forming layers is provided, the above described etching steps may be performed to form the pair of gate trenches 104. The gate trenches 104 are formed such that each of the two-dimensional charge carrier gas channels 106 are exposed at the first and second sidewalls 124, 126 of the gate fin 102.

Exemplary device parameters for the transistor device 100 with the multi-channel gate fin 102 are as follows. Each of the semiconductor nitride layers within the gate fin 102 may have a thickness of between 5 nm and 80 nm. In a preferred embodiment, each of the barrier layers 110 have a thickness of between 40 nm and 80 nm. This thickness is measured in a vertical direction that is perpendicular to the upper surface 103 of the semiconductor body 101. A separation distance between the gate trenches 104 that defines the width of the gate fin 102 may be 100 nm or less. In a preferred embodiment, this separation distance is 65 nm or less. A vertical distance between the deepest two-dimensional charge carrier gas channel 106 and the seed region 134 of the semiconductor body 101 is between 50 nm to 1000 nm. In a preferred embodiment, this distance is between 100 nm to 500 nm.

According to an embodiment, at least one of layers from one of the layer pairs 138 has a different thickness and/or alloy concentration than a corresponding layer from another one of the layer pairs 138 within the gate fin 102. For instance, the gate fin 102 may be configured such that there is a gradual change in thickness and/or alloy concentration of the barrier layers 110 moving from top to bottom of the gate fin 102, or vice-versa. Alternatively, the gate fin 102 may be configured such that there is a maximum or minimum in thickness and/or alloy concentration of the barrier layer 110 that is located at a vertical midpoint of the gate fin 102, with the barrier layers 110 above and below this barrier layer having lower thickness and/or alloy concentration (in the case of a maximum) or high thickness and/or alloy concentration (in the case of a minimum). The thicknesses of the barrier layers 110 and/or channel layers 108 within each gate fin 102 may be varied from one another to optimize $R_{ON}$ performance and electrical field distribution, for example.

According to an embodiment, an uppermost barrier layer 110 of the gate fin 102, i.e., the barrier layer 110 that extends to the top surface of the gate fin 102, has a greater thickness than each subjacent one of the barrier layers 110 within the gate fin 102. For instance, the uppermost barrier layer 110 may be a layer of AlGaN with a thickness of about 300 nm, whereas the subjacent barrier layers 110 may each have a thickness that is no greater than 100 nm, and specifically no greater than 80 nm. Generally speaking, by forming the uppermost barrier layer 110 to have a greater thickness, beneficial electrical properties are obtained due to interface charge behavior. A technique for forming uppermost barrier layer 110 to have a greater thickness may include the following. After providing a semiconductor body 101 to include the layered stack of heterojunction forming layers and etching the gate trenches 104, an AlGaN regrowth process is performed.

The multi-channel gate fin 102 configuration of FIG. 3 advantageously offers low $R_{ON}$ (on-resistance) in comparison to the previously described single-channel embodiment, due to the provision of multiple parallel channels. However, as the number of two-dimensional charge carrier gas channels 106 increases, it becomes difficult, and impossible at some point, to fully control the two-dimensional charge carrier gas channels 106 exclusively from above. To this end, the fin-shaped configuration provides an effective structure for depleting the lower two-dimensional channels through a lateral electric field that is applied to the sidewalls. In particular, the region of doped type III-nitride semiconductor material 122 is highly effective at generating a lateral electric field that depletes the lower two-dimensional channels in the multi-fin device, and consequently provides predictable ON-OFF control. However, in the multi-channel configuration, gate leakage issues are multiplied, as the multiple two-dimensional charge carrier gas channels 106 represent multiple leakage paths at the first and second sidewalls 124, 126 of the gate fin 102. Moreover, the multi-layer configuration produces parasitic two-dimensional charge gas regions opposite from the channels of the device. In the above described GaN/AlGaN example, for each channel layer 108 that is sandwiched between barrier layers, a naturally occurring two-dimensional hole gas (2DHG) forms on an opposite side of the channel layer as the 2DEG. This naturally occurring 2DHG represents an additional leakage path for holes injected from the gate electrode 120 into the region of doped type III-nitride semiconductor material 122 to enter the 2DHG and flow to the source of the device. Accordingly, the current blocking devices incorporated into the gate structure 118 as described herein are especially beneficial to performance in the multi-channel case. In the depicted embodiment, the transistor device 100 includes the Schottky diode 130 as described above. Accordingly, under positive gate bias, carriers are prevented from entering the doped type III-nitride semiconductor material, and the above describe leakage mechanism is substantially mitigated.

Referring to FIG. 4, the transistor device 100 is depicted, according to another embodiment. In this embodiment, the transistor device 100 is identical to that of FIG. 3, except that it additionally includes the layer of type III-nitride semiconductor material 136 that covers the gate fin 102 and is formed along the first and second sidewalls 124, 126 of the gate fin 102, e.g. in the same manner as described with reference to FIG. 2. Accordingly, the same beneficial impacts with respect to gate leakage are realized. That is, the layer of type III-nitride semiconductor material 136 forms a PIN diode at the first and second sidewalls 124, 126 of the gate fin 102, which mitigates forward and reverse gate leakage current between the region doped type III-nitride semiconductor material 122 and the gate fin 102.

Figure 5A:
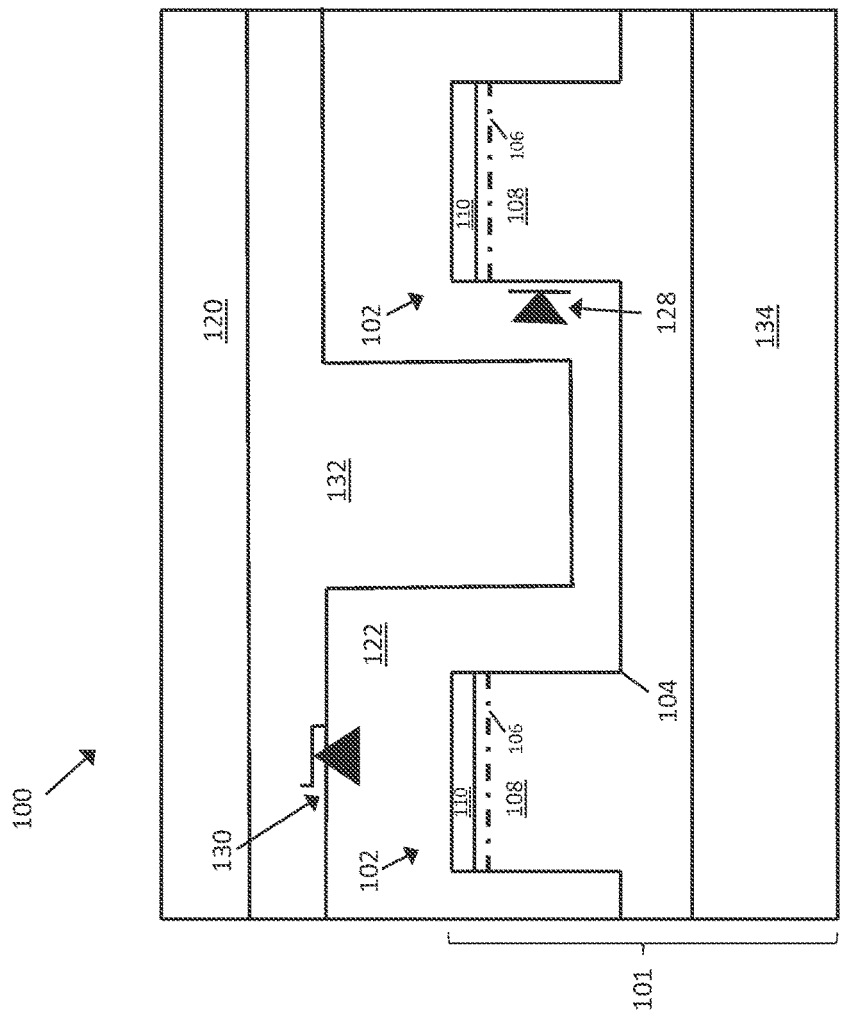

Referring to FIG. 5, the transistor device 100 is depicted, according to another embodiment. In this embodiment, the conductive Schottky contact material 132 extends into each of the gate trenches 104. This configuration can be achieved by etching the region of doped type III-nitride semiconductor material 122 prior to deposition of the Schottky contact material 132, for example. This configuration may provide a lower gate resistance, which beneficially improves the power consumption and switching performance of the device.

Figure 6B:
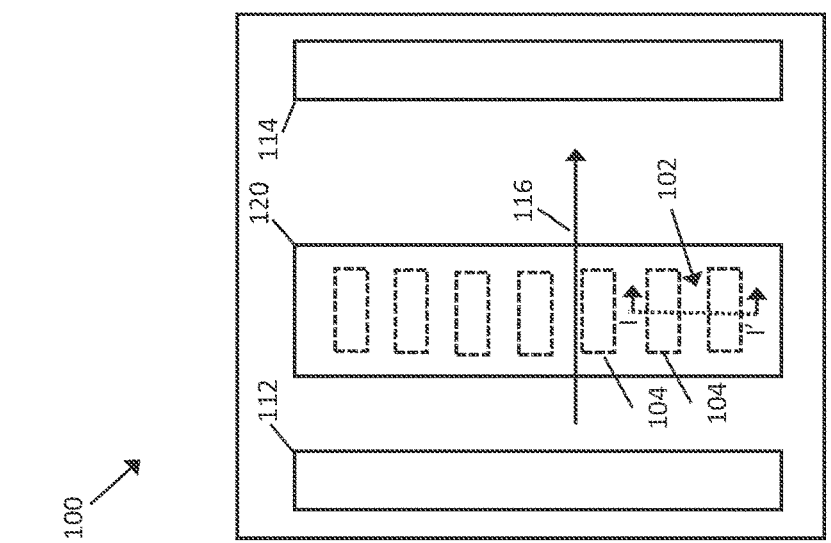
FIGS. 6A and 6B, illustrates a transistor device, according to an embodiment.
Figure 6A:
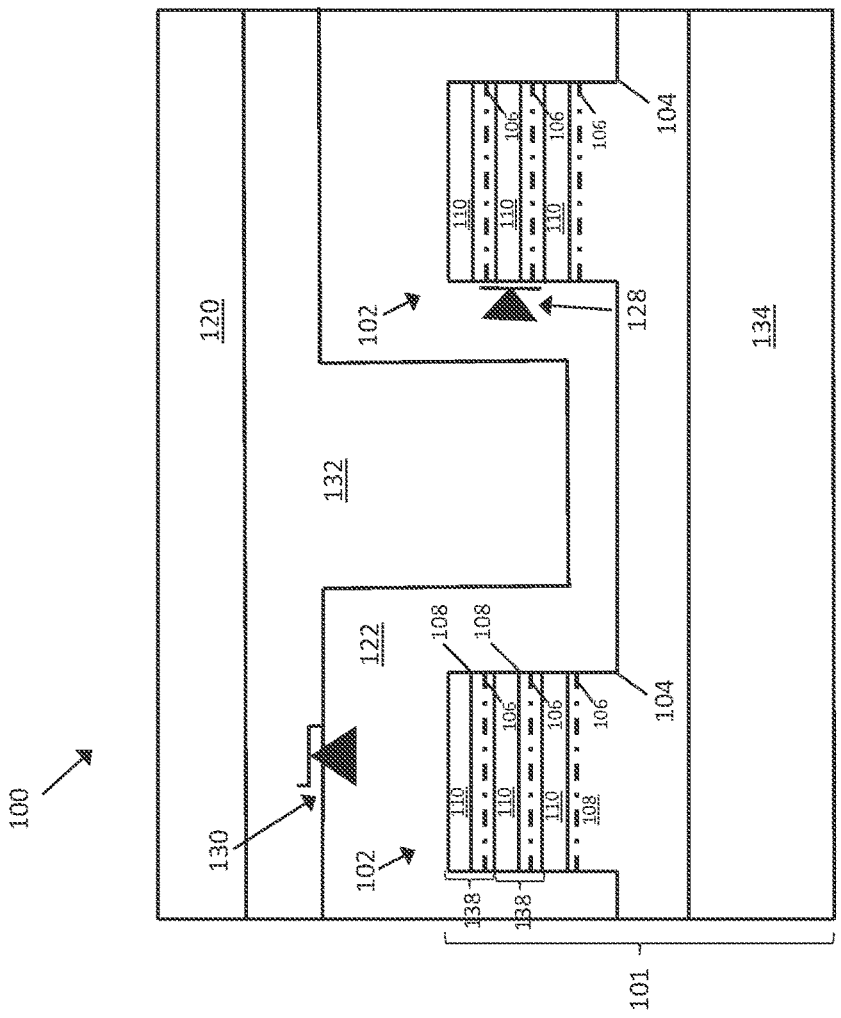

Referring to FIG. 6, the transistor device 100 is depicted, according to another embodiment. In this embodiment, the transistor device 100 includes the multi-channel fin configuration as previously described in combination with the configuration of the conductive Schottky contact material 132 extending into the gate trenches 104, as described above with reference to the embodiment of FIG. 5. A similar benefit of lower gate resistance can be obtained in this device.

Figure 7B:
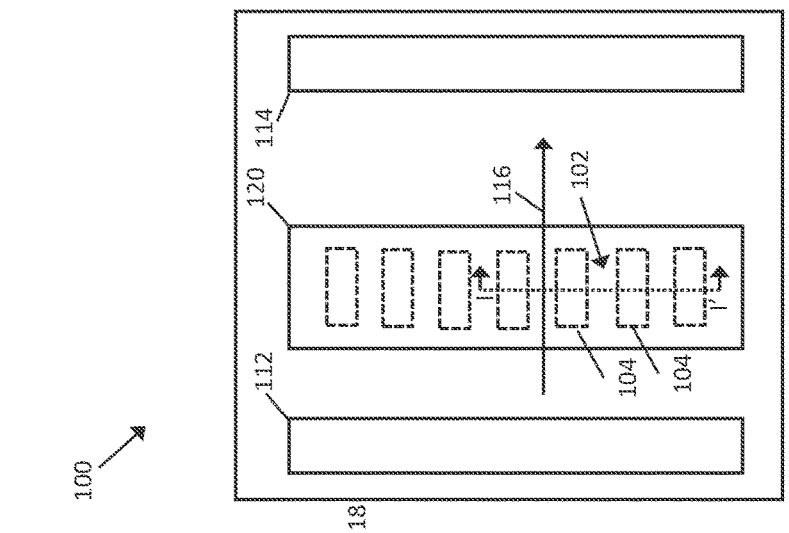
FIGS. 7A and 7B, illustrates a transistor device, according to an embodiment.
Figure 7A:
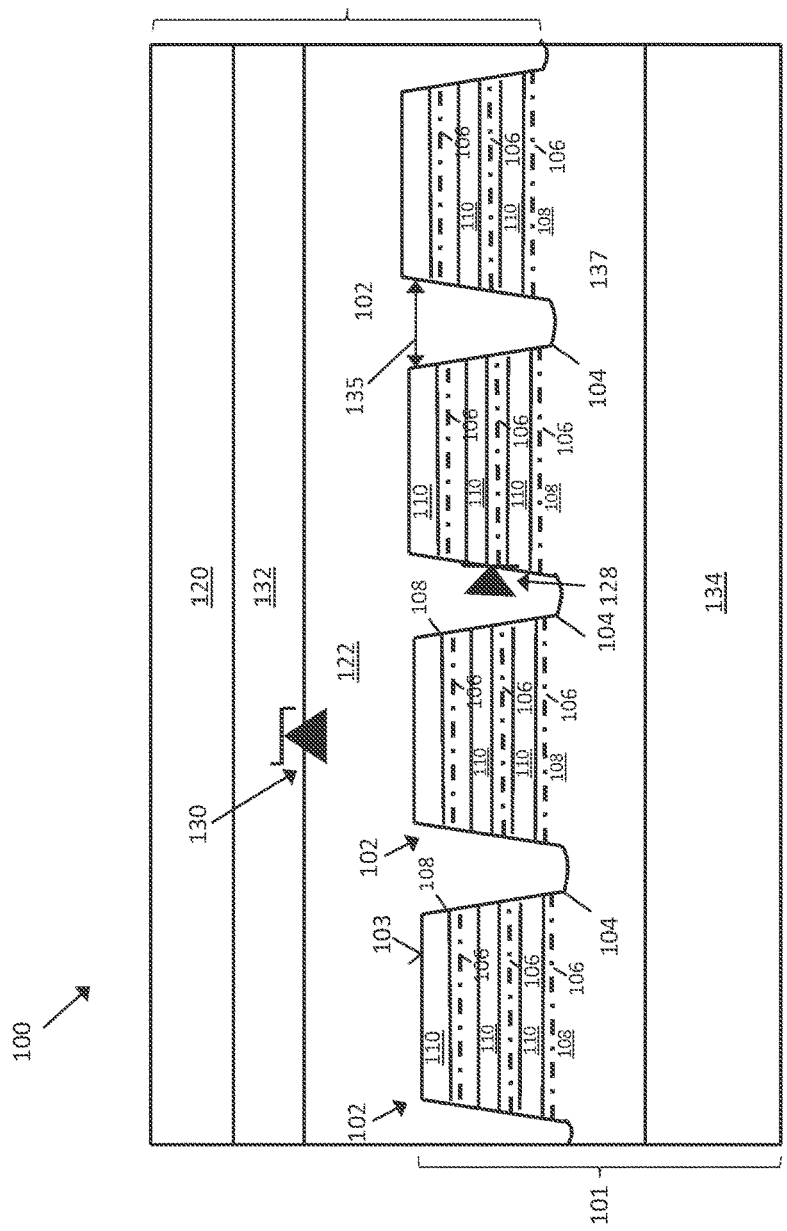

Referring to FIG. 7, the transistor device 100 is depicted, according to another embodiment. In this embodiment, the gate trenches 104 are tapered in a vertical direction that is perpendicular to the upper surface 103 of the semiconductor body 101 such that a width of the gate trench 104 decreases moving towards a bottom of the gate trench 104. As a result, the gate fins 102 are narrowest at the top of the gate fin 102. This configuration allows for the tuning of the width and thickness of the channel and barrier layers 108, 110 for each gate fin 102. For example, by tuning the thicknesses of the channel and barrier layers 108, 110, the depletion behavior as a function of vertical taper in the gate trench 104 may be controlled for achieving an optimized device. Exemplary values for a first width 135 of the gate trenches 104 at the upper surface 103 of the semiconductor body 101 may be between 30 nm and 1000 nm and more preferably between 100 nm to 300 nm. The gate trench 102 may be vertically tapered such that the sidewalls are oriented anywhere between 45 degrees and less than 90 degrees, relative to the upper surface 103. A negative taper wherein the gate trench 102 becomes wider moving towards a bottom of the trench is possible as well.

Referring to FIG. 8, three embodiments of the transistor device 100 are depicted. In each embodiment, the gate trenches 104 are tapered along the current flow direction 116 such that a width of the gate fin 102 increases as the gate fin 102 approaches the drain contact 114. As the gate fin 102 has an inverse geometry as the first and gate trenches 104, this means the gate trenches 104 taper inward as they approach the drain contact 114. One benefit of this configuration is that electric fields are reduced at critical locations, thus providing a similar effect as a field plate. This allows for higher breakdown voltage $V_{BR}$ for a given on-resistance $R_{ON}$.

Figure 8C:
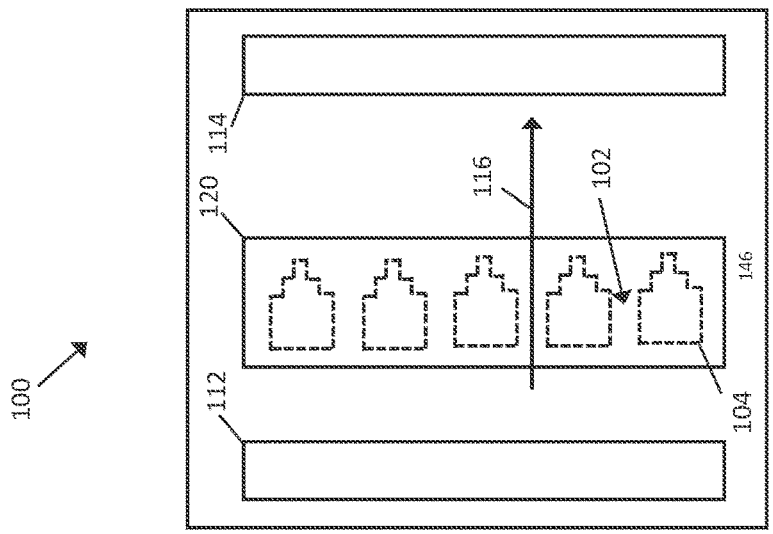
FIGS. 8A, 8B and 8C, illustrates three embodiments of a transistor device from a plan-view perspective.
Figure 8B:
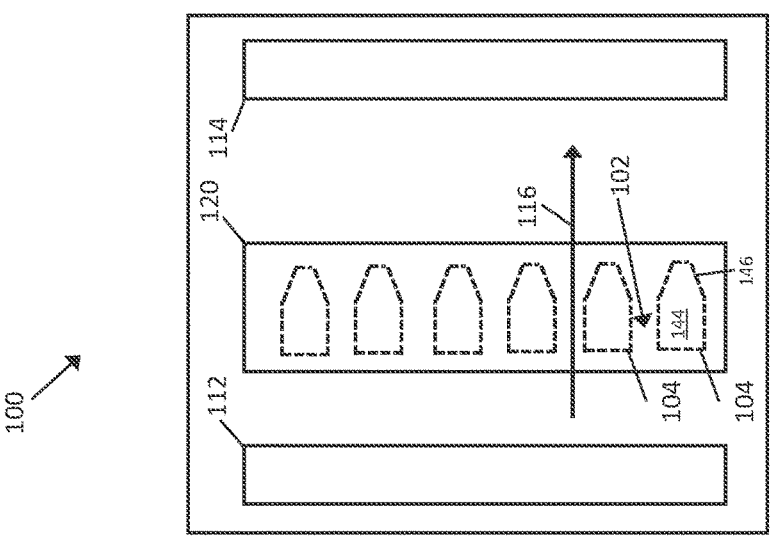
Figure 8A:
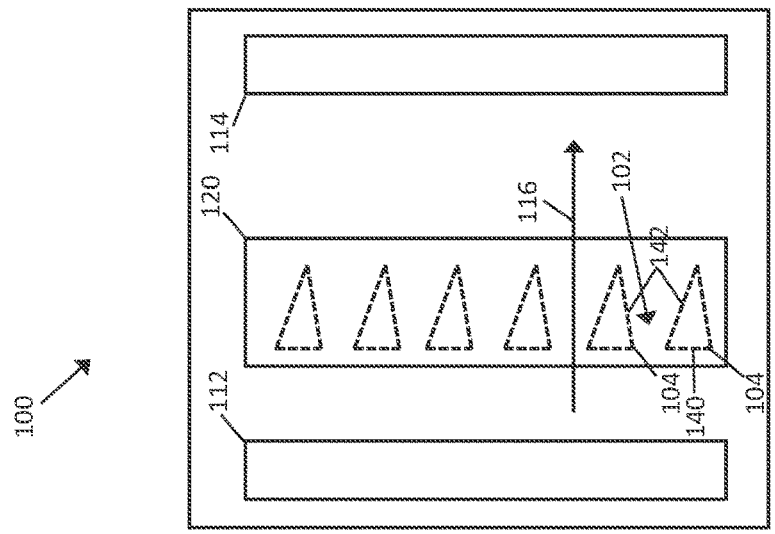

In the embodiment of FIG. 8A, the gate trenches 104 have a triangular shape. Each triangle includes a first side face 140 that faces the source contact 112 and is substantially orthogonal to the current flow direction 116 and a second side face 142 which extends from the first side face 140 to a point which faces the drain contact 114. The second side face 142 and thus the sidewalls of the gate fin 102 tilted relative to the current flow direction 116.

In the embodiment of FIG. 8B, the gate trenches 104 include a rectangular section 144 and a tapered section 146. The gate fin 102 has a substantially uniform width between the rectangular sections 144 of the gate trenches 104. In this region, the sidewalls of the gate fin 102 run parallel to the current flow direction 116. The width of the gate fin 102 increases between the tapered sections 146 as the gate fin 102 approaches the drain contact 114. In this region, the sidewalls of the gate fin 102 are tilted relative to the current flow direction 116.

In the embodiment of FIG. 8C, the gate trenches 104 include a plurality of rectangular sections that are arranged next to one another in the current flow direction 116. The width of each rectangular section is varied in a direction that is perpendicular to the current flow direction 116. The width of the gate fin 102 increases between each successively narrower rectangular section as the gate fin 102 approaches the drain contact 114.

In each of the depicted examples of FIG. 8, the gate trenches 104 are tapered along the current flow direction 116 such that the narrowest portion of the gate fin 102 is at an end of the gate fin 102 that faces source contact 112. Alternatively, the gate trenches 104 may be tapered along the current flow direction 116 such that the narrowest portion of the gate fin 102 occurs between the two ends of the gate fin 104 which face the source and drain contacts 112, 114. That is, the location of minimal spacing between two adjacent gate trenches 104 is not necessarily at the ends of the gate trenches 104.

Figure 9C:
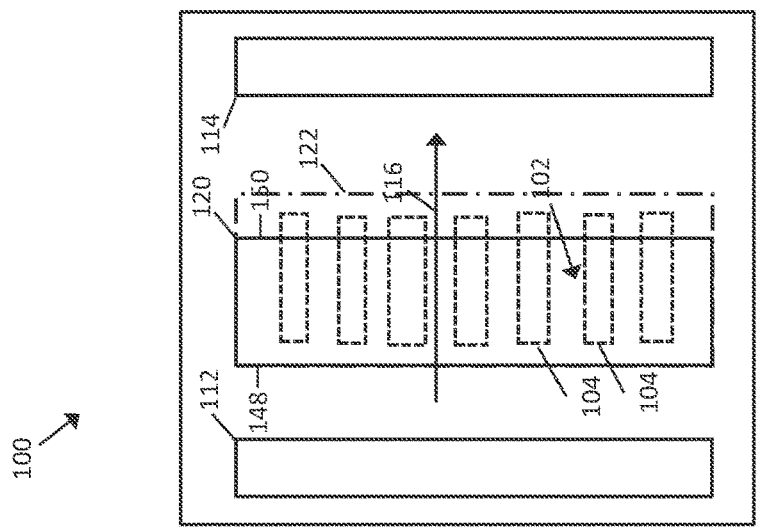
FIGS. 9A, 9B and 9C, illustrates three embodiments of a transistor device from a plan-view perspective.
Figure 9B:
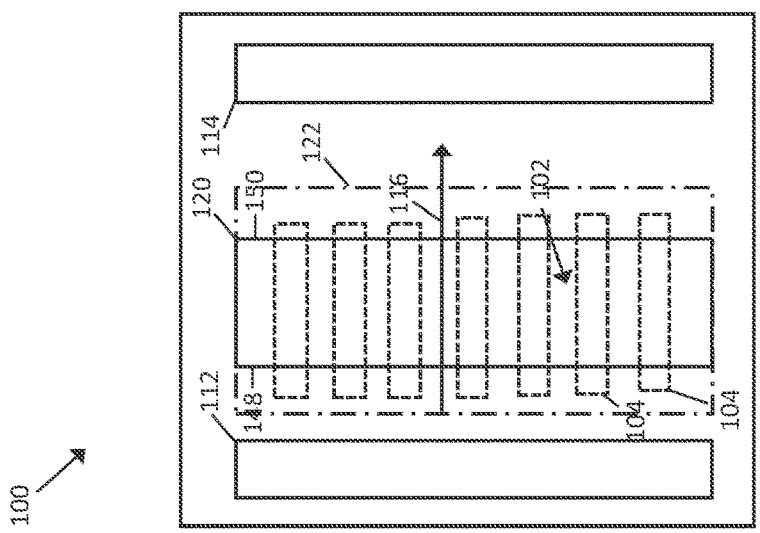
Figure 9A:
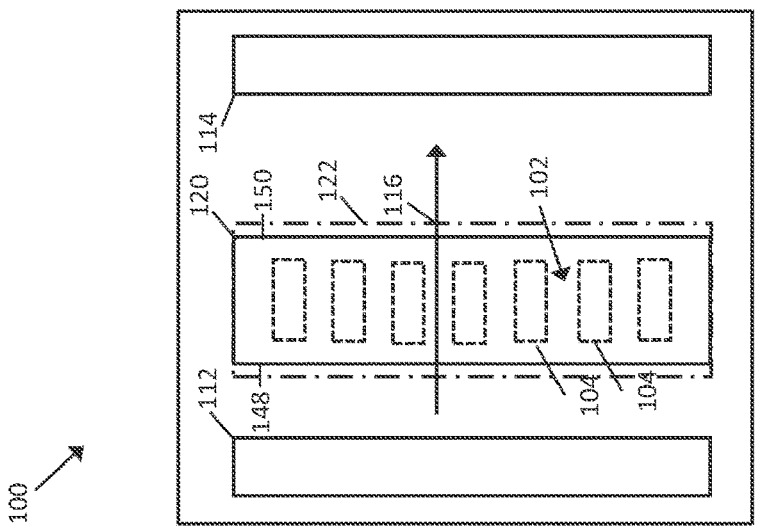

Referring to FIG. 9, three different embodiments of the transistor device 100 are depicted. These embodiments differ from one another with respect to the placement of the gate trenches 104 relative to the gate electrode 120. In each figure, the gate electrode 120 includes first and second outer edge sides 148, 150 that extend transversely to the current flow direction 116. In the embodiment of FIG. 9A, the gate trenches 104 are completely contained within the first and second outer edge sides 148, 160 of the gate electrode 120. In the embodiments of FIGS. 9B and 9C, the gate trenches 104 extend past at least one of the first and second outer edge sides 148, 150 of the gate electrode 120. More particularly, in the embodiment of FIG. 9B, the gate trenches 104 extend past both the first and second outer edge sides 148, 150. In the embodiment of FIG. 9C, the gate trenches 104 extend only past the second outer edge side 150 which faces the drain electrode 114. These examples illustrate the beneficial flexibility of forming the device by forming pairs of spaced apart trenches in the semiconductor body 101, as precise alignment between the trenches and the gate metallization is not necessary.

FIG. 9 additionally depicts exemplary arrangements for the region of doped type III-nitride semiconductor material 122 relative to the gate trenches 104 and the gate electrode 120. Generally speaking, the location of the region of doped type III-nitride semiconductor material 122 within the gate structure 118 can be flexibly adjusted relative to the gate trenches 104. In each of the depicted embodiments, the region of doped type III-nitride semiconductor material 122 is formed to be wider than the gate trenches 104. This maintains a planar surface above the trenches 104 for the deposition of the gate metal 134 thereon.

Referring to FIG. 10, four different embodiments of the transistor device 100 are depicted. These embodiments differ from one another with respect to the structuring of the Schottky contact material 132 and the region of doped type III-nitride semiconductor material 122 at the edge of the gate structure 118. In each case, the transistor device 100 is shown along the cross-sectional line II-II' of the semiconductor body 101, which is taken at the outer edge of the gate structure 118 which faces the drain contact 114. 128

Figure 10A:
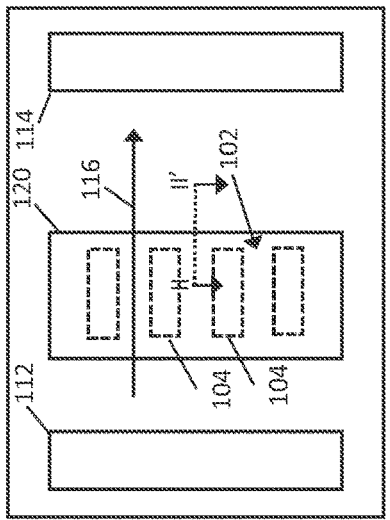
FIGS. 10A, 10B, 10C, 10D and 10E, illustrates a transistor device, according to different embodiments.
Figure 10E:
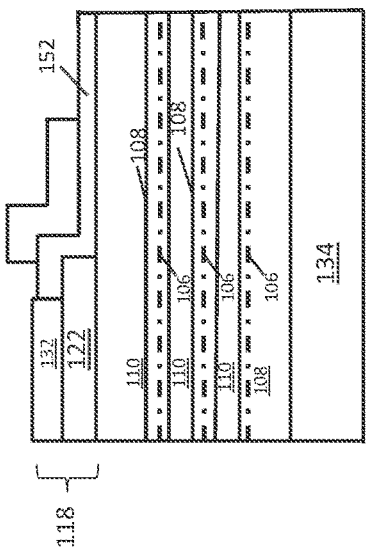
Figure 10D:
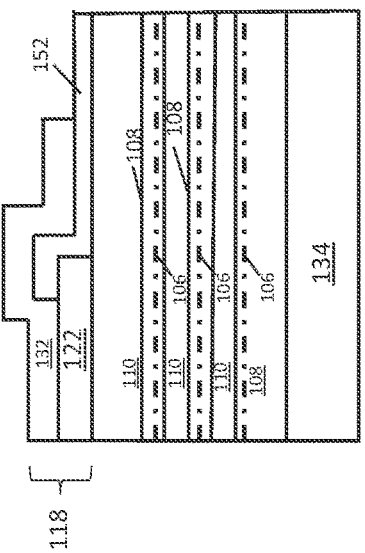
Figure 10B:
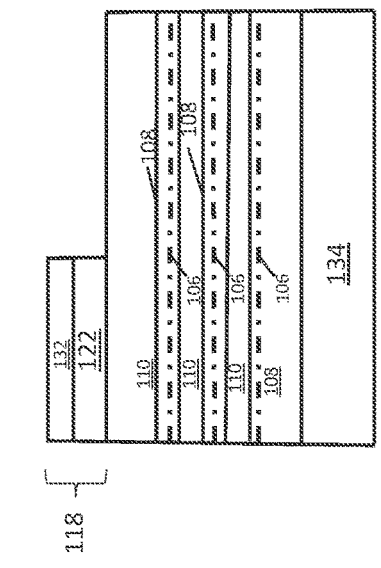

In the embodiment of FIG. 10B, the conductive Schottky contact material 132 and the region of doped type III-nitride semiconductor material 122 form a self-aligned edge side of the gate structure 118. This structure may be obtained by depositing the doped type III-nitride semiconductor material as a blanket layer on the semiconductor body 101 (e.g., by epitaxy) and forming the Schottky contact material 132 on top of the blanket layer. The Schottky contact material 132 is structured, e.g., through deposition and/or masked etching techniques. An edge side of the gate structure 118 that runs transverse (e.g., perpendicular) to the current flow direction 116 is formed by structuring the Schottky contact material 132 and the blanket layer of the doped type III-nitride semiconductor material with a common mask. In one example, the conductive Schottky contact material 132 itself is used as an etching mask. Alternatively, both layers may be structured using a common photomask. While the depicted embodiment depicts the edge of the gate structure 118 between the gate fins 102 and the drain contact 114, the same techniques may be applied to the edge of the gate structure 118 between the gate fins 102 and the source contact 112.

Figure 10C:
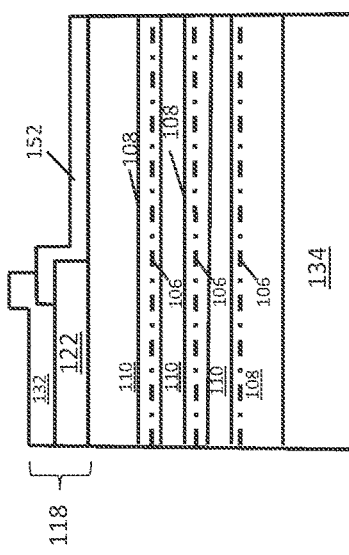

In the embodiment of FIG. 10C, the Schottky contact material 132 and the doped type III-nitride semiconductor material are not formed by self-aligned techniques. Instead, the region of doped type III-nitride semiconductor material 122 is initially formed and structured, e.g., using a masked etching technique. Subsequently, a passivation layer 152 is formed to overlap with the edge side of the doped type III-nitride semiconductor material. The passivation layer 152 may be a protective and electrically insulating layer (e.g., silicon nitride, silicon oxynitride, etc.) that is formed by known deposition and structuring techniques, for example. Subsequently, the Schottky contact material 132 is deposited on top of the region of doped type III-nitride semiconductor material 122 such that the Schottky contact material 132 overlaps with the passivation layer 152. This technique mitigates any misalignment issues between the formation of the Schottky contact material 132 and the doped type III-nitride semiconductor material.

The embodiment of FIG. 10D is substantially identical to that of FIG. 10B, except that the Schottky contact material 132 is intentionally formed to extend past the edge side of the gate structure 118. The extended portion of the Schottky contact material 132 forms a field plate structure over the drift region of the device, thereby improving the breakdown voltage $V_{BR}$ for a given on-resistance $R_{ON}$. In this case, the potential of the field plate is tied to the gate potential of the device.

The embodiment of FIG. 10E is substantially identical to that of FIG. 10E, except that the Schottky contact material 132 is disrupted between the gate structure 118 and the drift region of the device. This allows for a field plate that is tied to a potential source independent from the gate potential (e.g., source potential).

In the above described embodiments, the heterojunction forming layers of the semiconductor body, i.e., the channel layer and barrier layer, are disclosed as GaN based semiconductor layers. GaN is used for illustrative purposes only. More generally, any of a variety of combinations of type III-nitride semiconductor materials can be used to provide the device concept described herein. Examples of these materials include, inter alia, gallium arsenide (GaAs), gallium phosphide (GaP), indium phosphide (InP), indium gallium nitride (InGaN) and indium gallium arsenide (InGaAs). In a broad sense, the compound semiconductor transistors described herein can be formed from any binary, ternary or quaternary type III-nitride semiconductor materials where piezoelectric effects are responsible for the device concept.

The term HEMT is also commonly referred to as HFET (heterostructure field effect transistor), MODFET (modulation-doped FET) and MESFET (metal semiconductor field effect transistor). The terms HEMT, HFET, MESFET and MODFET are used interchangeably herein to refer to any III-nitride based compound semiconductor transistor incorporating a junction between two materials with different band gaps (i.e., a heterojunction) as the channel.

The term "electrically connected" intends to describe a low-ohmic electric connection between the elements electrically connected together, e.g. a connection via a metal and/or highly doped semiconductor.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a transistor device, comprising:
providing a semiconductor body comprising a plurality of two-dimensional charge carrier gas channels that are disposed at different vertical depths below an upper surface of the semiconductor body;
forming a gate fin in the semiconductor body by forming a pair of gate trenches in an upper surface of the semiconductor body, the pair of gate trenches exposing each one of two-dimensional charge carrier gas channels in the plurality at first and second sidewalls of the gate fin;
providing source and drain contacts that are arranged such that the gate fin is between the source and drain contacts in a current flow direction of the gate fin and such that each of the source and drain contacts is electrically connected to each one of the plurality of two-dimensional charge carrier gas channels;
providing a gate structure that is configured to control a conductive connection between the source and drain contacts by controlling a conductive state of each one of the plurality of two-dimensional charge carrier gas channels;
wherein providing the gate structure comprises:
    forming a region of doped type III-nitride semiconductor material that covers the gate fin and extends into the gate trenches;
    forming a conductive Schottky contact material on top of layer of doped type III-nitride semiconductor material; and
    forming a conductive gate electrode on top of the conductive Schottky contact material; and
wherein the method further comprises forming one or more current blocking devices that are configured to prevent carriers from flowing into or out of the region of doped type III-nitride semiconductor material,
wherein each of the two-dimensional charge carrier gas channels extends to the first and second sidewalls of the gate fin, and wherein the one or more current blocking devices are configured to prevent carriers from flowing in both directions between the region of doped type III-nitride semiconductor material and each of the two-dimensional charge carrier gas channels at the first and second sidewalls of the gate fin.

2. The method of claim 1, wherein providing the gate structure comprises
forming a self-aligned edge side of the gate structure by structuring the Schottky contact material and the region of the doped type III-nitride semiconductor material with a common mask.

3. The method of claim 1, wherein providing the gate structure comprises: depositing a blanket layer of the doped type III-nitride semiconductor material;
structuring the blanket layer of the doped type III-nitride semiconductor material to include an edge side which extends transverse to the current flow direction;
forming a passivation layer that covers the upper surface of the semiconductor body and extends over the edge side of the doped type III-nitride semiconductor material; and
depositing the conductive Schottky contact material such that the Schottky contact material contacts the doped type III-nitride semiconductor material and extends over the passivation layer.

4. The method of claim 3, wherein the Schottky contact material is formed to extend past the edge side of the doped type III-nitride semiconductor material, and wherein the method further comprises configuring the Schottky contact material that extends past the edge side of the doped type III-nitride semiconductor material as a field plate.

5. The method of claim 1, wherein the one or more current blocking devices comprises a layer of type III-nitride semiconductor material that covers the gate fin and is formed along the first and second sidewalls of the gate fin.

6. The method of claim 5, wherein the gate fin comprises a layered stack of GaN based layer pairs with different aluminum content, wherein the two-dimensional charge carrier gas channels each arise near a heterojunction between the GaN based layers of each layer pair, and wherein the layer of type III-nitride semiconductor material is a layer of AlGaN with a different bandgap as channel layers from the GaN based layer pairs.

7. The method of claim 1, wherein the gate fin comprises multiple layer pairs of semiconductor nitride layers, wherein each layer pair comprises a barrier layer of type III-nitride semiconductor alloy and a channel layer of type III-nitride semiconductor, and wherein at least one of the barrier layers or channel layers from one of the layer pairs has a different thickness and/or alloy concentration than corresponding barrier layers or channel layers from other layer pairs within the gate fin.

8. The method of claim 7, wherein an uppermost barrier layer of the gate fin has a greater thickness than each subjacent one of the barrier layers within the gate fin.

9. The method of claim 7, wherein each of the semiconductor nitride layers within the gate fin has a thickness of between 5 nm and 100 nm.

10. The method of claim 9, wherein a separation distance between the pair of gate trenches is 200 nm or less.

11. The method of claim 1, wherein the gate fin comprises a channel layer of type III-nitride semiconductor material, and wherein the region of doped type III-nitride semiconductor material has a different bandgap as the channel layer.

12. The method of claim 11, wherein the channel layer is a layer of GaN, and wherein the region of doped type III-nitride semiconductor material is a region of p-type AlGaN.

13. The method of claim 1, wherein the gate trenches are tapered along the current flow direction such that a width of the gate fin increases as the gate fin approaches the drain contact.

14. The method of claim 13, wherein both of the gate trenches have a triangular shape with a first side face that faces the source electrode and is substantially orthogonal to the current flow direction and a second side face which extends from the first side face to a point which faces the drain electrode.

15. The method of claim 13, wherein both of the gate trenches comprise a rectangular section and a tapered section, wherein the gate fin has a substantially uniform width between the rectangular sections of the gate trenches, and wherein the width of the gate fin increases between the tapered sections of the gate trenches as the gate fin approaches the drain contact.

16. The method of claim 1, wherein both of the gate trenches are tapered in a vertical direction that is perpendicular to the upper surface of the semiconductor body such that a width of the gate trench decreases moving towards a bottom of the gate trench.

17. The method of claim 1, wherein the gate electrode comprises first and second outer edge sides that extend transversely to the current flow direction, and wherein the gate trenches are both completely contained within the first and second outer edge sides of the gate electrode.

18. The method of claim 1, wherein the gate electrode comprises first and second outer edge sides that extend transversely to the current flow direction, and wherein the gate trenches both extend past one or both of the first and second outer edge sides of the gate electrode.

* * * * *

UNITED STATES PATENT AND TRADEMARK OFFICE
CERTIFICATE OF CORRECTION

| | |
|---|---|
| PATENT NO. | : 11,929,430 B2 |
| APPLICATION NO. | : 17/563329 |
| DATED | : March 12, 2024 |
| INVENTOR(S) | : T. Detzel et al. |

It is certified that error appears in the above-identified patent and that said Letters Patent is hereby corrected as shown below:

In the Claims

Column 16, Line 56 (Claim 1), please change "on top of layer" to -- on top of the layer --.

Signed and Sealed this
Thirtieth Day of April, 2024

Katherine Kelly Vidal
*Director of the United States Patent and Trademark Office*